United States Patent
Thomas et al.

[19]

[11] Patent Number: 6,116,848
[45] Date of Patent: Sep. 12, 2000

[54] APPARATUS AND METHOD FOR HIGH-SPEED TRANSFER AND CENTERING OF WAFER SUBSTRATES

[75] Inventors: Donald Jeffrey Thomas, San Jose; Martin Peter Aalund, San Francisco; Robert Roy, Fremont; Michael Risi, San Jose, all of Calif.

[73] Assignee: Brooks Automation, Inc., San Jose, Calif.

[21] Appl. No.: 08/979,194

[22] Filed: Nov. 26, 1997

[51] Int. Cl.[7] .................................................. B25J 15/10
[52] U.S. Cl. ............................ 414/754; 414/783; 414/941
[58] Field of Search .................................. 414/700, 783, 414/936, 941, 935, 754

[56] References Cited

U.S. PATENT DOCUMENTS

| | | | |
|---|---|---|---|
| 4,655,584 | 4/1987 | Tanaka et al. | 414/936 |
| 5,052,886 | 10/1991 | Moroi | 414/936 |
| 5,161,083 | 11/1992 | Mohler et al. | 361/143 |
| 5,556,147 | 9/1996 | Somekh et al. | |
| 5,570,994 | 11/1996 | Somekh et al. | |
| 5,636,964 | 6/1997 | Somekh et al. | |
| 5,647,626 | 7/1997 | Chen et al. | |
| 5,664,931 | 9/1997 | Brugger et al. | |
| 5,788,453 | 8/1998 | Donde et al. | 414/941 |
| 5,851,041 | 12/1998 | Anderson et al. | 414/941 |

FOREIGN PATENT DOCUMENTS

| | | | |
|---|---|---|---|
| 3-213391 | 3/1993 | Japan | 414/941 |

*Primary Examiner*—Gregory A. Morse
*Attorney, Agent, or Firm*—Fernandez & Associates, LLP

[57] ABSTRACT

An apparatus for centering and gripping semiconductor wafers. A solenoid is used to actuate two or three curved contacts. Power to the solenoid, and position information from the solenoid is transmitted along a pair of wires. To center the wafer, the solenoid is actuated and the contacts move radially towards the center of the wafer. The contacts grip the edge of the wafer and a pulse-width-modulation signal is used to determine solenoid position as a function of back electromotive force value or waveform. During handling, the contacts hold the wafer such that the wafer does not move relative to the apparatus.

22 Claims, 7 Drawing Sheets

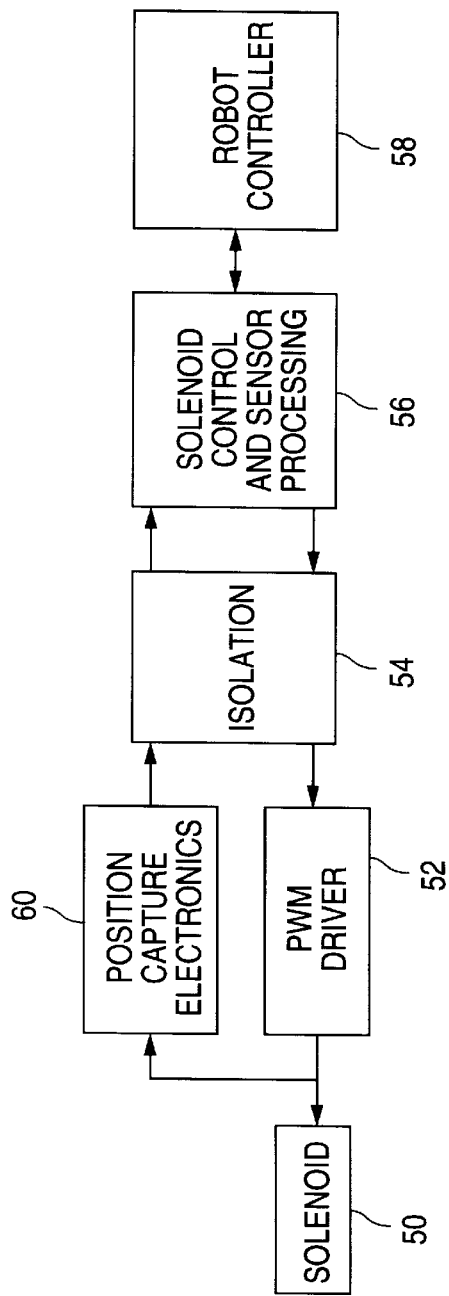
FIG. 6
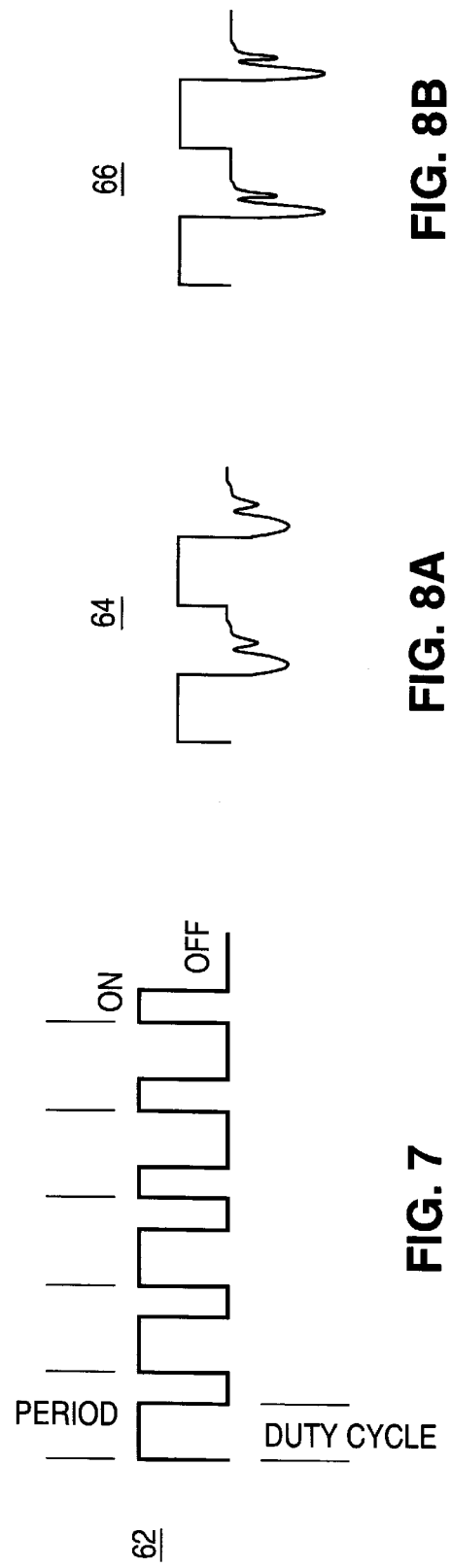
FIG. 7
FIG. 8A
FIG. 8B

```
// Psuedo Code to operate Active Gripper.
DoSub:  Move (Wafer Pickup Position);        // Moves to Robot to Wafer Pickup Position
        // Open Gripper
        Set PWM = PWM_ON                     // command to High Duty Cycle
        For j = 1 to Delay;                  // wait for solenoid to open
        For I=1 to N                         // Get Back EMF Average value
                EMF_Ave += EMF_Value;
        EMF_Ave = EMF_Ave/N
        IF EMF_Ave = EMF_Open
            Next;                            // Solenoid is open
            Else {
                Error = Open_Error;
                Goto Error;
                }
        EndIF;
        Set PWM = PWM_Open;                  // Reduce Power to solenoid once it is open
DoSub   RaiseGripper();                      // Raises the gripper to lift Wafer.
        // Close Gripper
        Set PWM = PWM_Close;                 // command to Lower Duty Cycle
        For j = 1 to Delay;                  // wait for solenoid to open
        For I=1 to N                         // Get Back EMF Average value
                EMF_Ave += EMF_Value;
        EMF_Ave = EMF_Ave/N
        IF EMF_Ave = EMF_Wafer
            Next;                            // Wafer is gripped.
            Else {
                Error = Grip_Error;          // Wafer was not gripped.
                Goto Error;
                }
        EndIF;
DoSub Move(Wafer Drop Zone);                 // Moves Wafer to Drop off position.
        // Open the Gripper
        Set PWM = PWM_ON                     // command to High Duty Cycle
        For j = 1 to Delay;                  // wait for solenoid to open
        For I=1 to N                         // Get Back EMF Average value
                EMF_Ave += EMF_Value;
        EMF_Ave = EMF_Ave/N
        IF EMF_Ave = EMF_Open
            Next;                            // Solenoid is open
            Else {
                Error = Open_Error;
                Goto Error;
                }
        EndIF;
        Set PWM = PWM_Open;                  // Reduce Power to solenoid once it is open
DoSub Lower()                                // Lowers the Gripper
```

APPARATUS AND METHOD FOR HIGH-SPEED TRANSFER AND CENTERING OF WAFER SUBSTRATES

FIELD OF INVENTION

The invention relates to an electromechanical equipment for robotically moving semiconductor substrates, and particularly to wafer transfer and centering techniques.

BACKGROUND OF INVENTION

During semiconductor manufacturing or processing, silicon wafers are moved between processing equipment, typically using robotic techniques. Because wafers are fragile and increasingly larger in size, careful handling and positioning is desirable. In particular, during a transfer, efficient wafer centering on a transfer platform is important. Conventional wafer handling approaches, however, do not provide satisfactory centering solution. For example, see U.S. Pat. Nos. 5,556,147, 5,570,994, 5,636,964, 5,647,626, 5,664,931.

SUMMARY OF INVENTION

The invention resides in an electromechanical system for centering a semiconductor wafer substantially on a movable platform having multiple alignment contacts. Preferably, contacts are actuated by a solenoid, which senses a wafer presence and position, as well as conducts diagnostics. Minimal wiring couples to actuators and solenoid.

During wafer handling, actuators contact wafer edge, and a solenoid receives pulse-width-modulation signal to determine the position as a function of back electromotive force value or waveform. The solenoid may apply force to actuators according to measured actuator positions. Centering is achieved substantially by clamping on a wafer using actuated contacts.

BRIEF DESCRIPTION OF DRAWINGS

FIG. 6 is an electrical block diagram of control electronics for implementing the present invention.

FIG. 7 is a representative signal diagram for controlling apparatus according to the present invention.

FIGS. 8A–B are representative signal diagrams for controlling apparatus according to the present invention.

FIG. 9 is representative pseudo-code for implementing system according to the present invention.

DETAILED DESCRIPTION OF PREFERRED EMBODIMENT

A preferred embodiment of the present invention is provided in a passive or active electromechanical apparatus or end effector and associated methodology for handling semiconductor wafers or similarly shaped substrates, flat objects or thin panels, particularly for centering wafers substantially on movable platform or robotic arm end effector having multiple alignment contacts. As described herein, contacts may be actuated by a solenoid, which effectively senses a wafer presence and position, as well as other diagnostic data. Also, as specified and claimed herein, the term "wafer" term is interpreted broadly, referring to any substantially flat or thin object or substrate.

Preferably, inventive apparatus contacts wafer about outer ring or wafer edge to reduce possible damage. The centering function is substantially accomplished without performing a true positional centering of a subject wafer relative to a robotic arm or end effector, as long as the subject wafer is physically aligned or gripped by an innovative wafer handling apparatus for fast transport in stable and secure manner.

When operating, actuators contact a wafer edge, and the solenoid receives a pulse-width-modulation signal to determine the position as a function of the back electromotive force value or waveform. The solenoid may apply force to actuators as a function of measured the solenoid position. Also, the solenoid may operate in an open-loop configuration to apply force. Centering as specified herein need not be exact and may be achieved substantially by clamping radially on a wafer using a coordinated motion of actuated contacts, for example, by applying a gripping force inwardly toward the virtual center point or middle area of a subject wafer.

Figure 1:
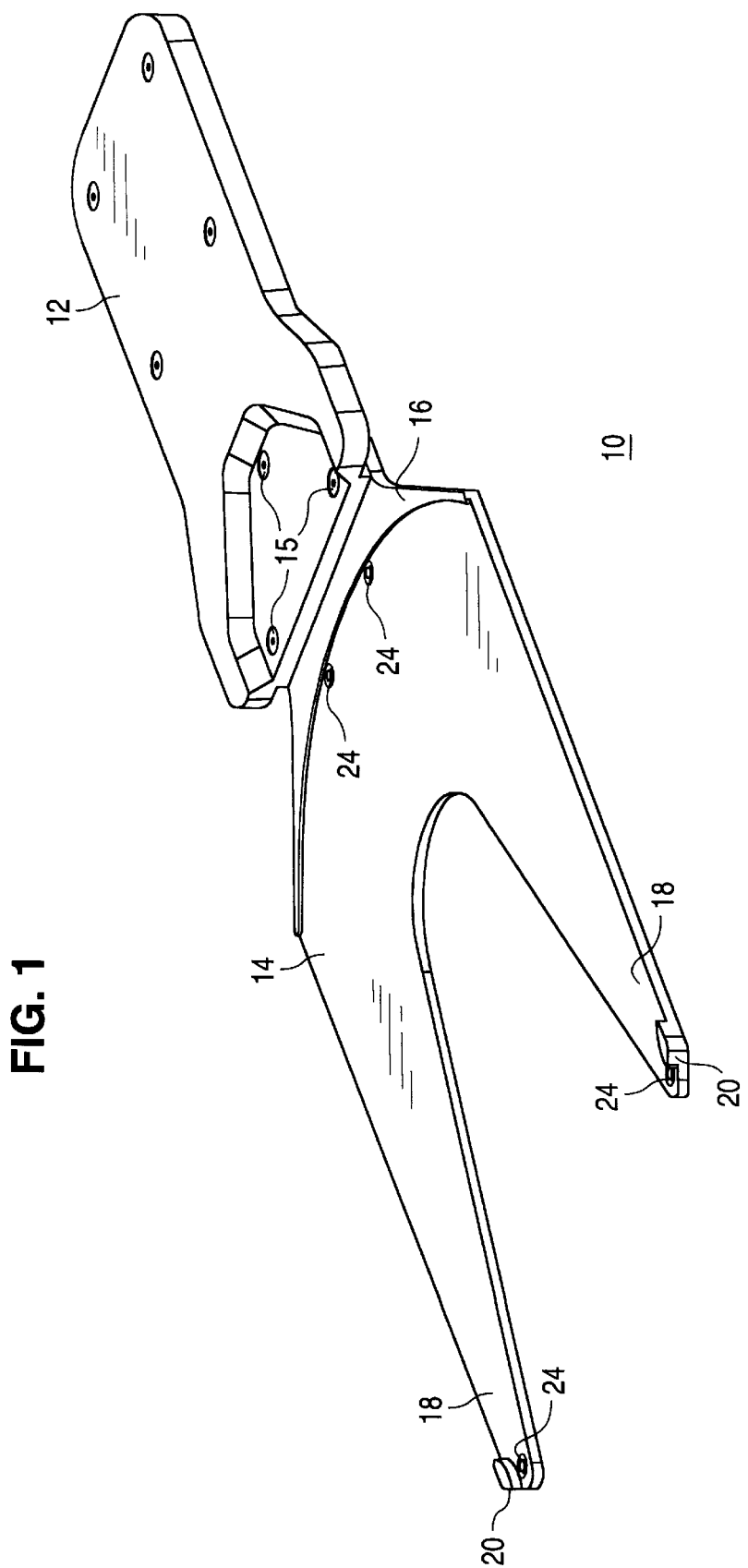
FIG. 1 is a mechanical diagram of a preferred embodiment of the present invention.

FIG. 1 shows a passive wafer handling or centering apparatus 10, which may couple rigidly through a base 12 to a robot arm mechanism (not shown), preferably using three mounting holes 15 for adjustably defining the level plane of a platform 14. The platform 14, connected by a neck or bracket 16 to the base 12 may be any shape as end effector which is rigid, flat, light-weight structure, such as a fixed ceramic blade, sufficiently sized for receiving conventionally-dimensioned silicon wafer or equivalent flat substrate object, such as 200 or 300 mm wafer. The neck structure 16 has a thicker or sturdier composition than the platform 14.

The platform 14 preferably includes one or more extensions 18 having alignment posts or contacts 20 mounted at each end. Additionally, the platform 14 may include simple bump structures or O-rings 24 composed of physically resistive material, such as elastomer, teflon, polymide, quartz, or ceramic, for supporting a wafer placed thereon, preferably disposed at an outer wafer rim, upon centering. This structure enables transport using edge contact, reducing the back-side contamination or damage of the wafer or substrate.

The passive apparatus 10 operates substantially as an end effector using a gross motion or momentum of a robotic arm to center the wafer, as the platform 14 registers received the wafer against two alignment posts 20 during a robotic wafer transfer operation. For example, before the subject a wafer is picked-up from wafer carrier, the platform blade 14 is moved retractably therein, slipping such wafer into or out of a cassette or other desired position. When subject wafer is placed on the platform 14 and registered against contacts 20, some gap may be provided between such wafer and the base 12.

The alignment posts 20, which are disposed substantially equidistantly or radially from the base 12, may be any shape or construction, including free rollers, and serve to contact subject wafer during pick-up, thereby centering the wafer between contact posts 20. As shown, the alignment posts 20 are positioned apart, such that subject wafer is alignable in direction tangential to the robot arm or base 12. Preferably, the O-ring pads 24 are positioned to contact subject wafer in the outer perimeter area, such as 1 mm zone, once the wafer is centered.

Figure 2:
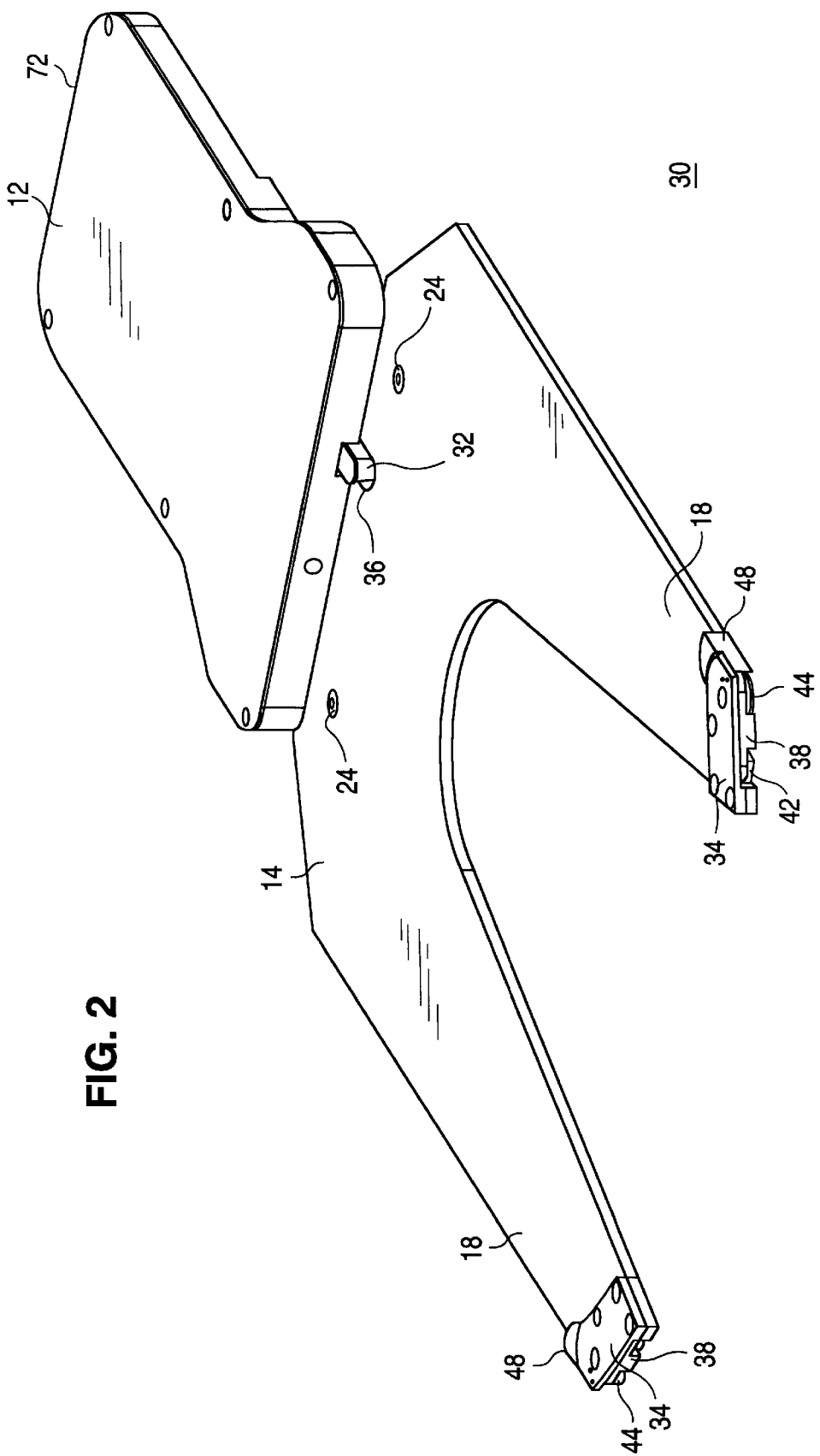
FIG. 2 is a mechanical diagram of an alternate embodiment (upper view) of the present invention.
Figure 3:
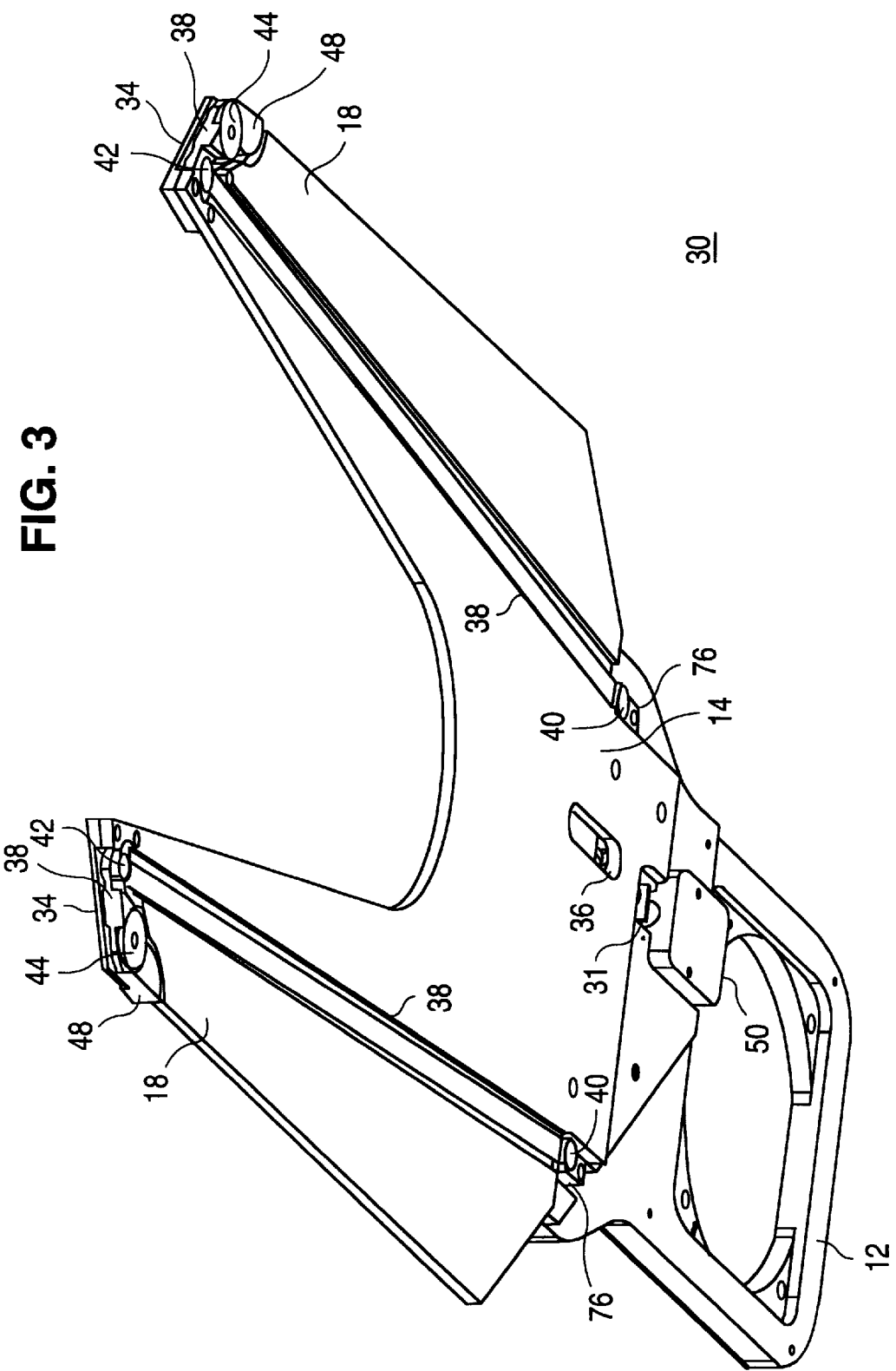
FIG. 3 is a mechanical diagram of an alternate embodiment (lower view) of the present invention.

FIG. 2 shows an upper view of an active wafer handling apparatus 30, which may couple as centering and gripping mechanism or end effector through the base 12 to some robot arm mechanism. FIG. 3 shows a lower view of an active wafer handling apparatus 30. Compared to the passive apparatus 10, the active apparatus 30 provides improved gripping function, but more functional complexity and system cost. As illustrated similarly for the passive apparatus 10, the platform 14, connected to the base 12 having a cover 72, is any shaped rigid, flat, light-weight structure, such as a fixed ceramic blade, for receiving conventionally-dimensioned silicon wafer or equivalent flat substrate object, such as 200 or 300 mm wafer. It is contemplated that the robotic arm movement may provide substantial acceleration, such as exceeding 1 g at times, without causing a wafer slippage.

In platform 14 includes one or more extensions 18 having alignment posts or contacts 34 mounted at each end. Additionally, the platform 14 includes simple bump structures or O-rings 24 preferably composed of physically resistive material, such as elastomer, teflon, polymide, quartz, or ceramic, for supporting a wafer placed thereon, preferably disposed at outer wafer rim, upon centering.

The active apparatus 30 operates as gripping mechanism or end effector to center wafer as the platform 14 registers received the wafer against two alignment posts or actuated contact portions 34 including active contacts 48. The active contacts 48, which are disposed substantially equidistantly or radially from the base 12, serve to contact subject wafer during pick-up, thereby centering the wafer. Combined thickness of the platform blade 14, the contact portion 24, and any wafer placed thereon should not exceed vertical opening allowance specified for moving such combined assembly unimpeded in and out of a wafer cartridge (not shown).

As shown, the active contacts 48 are positioned apart, such that subject wafer is alignable in direction tangential to the robot arm or base 12. Also, contacts 48, 36 are disposed about outer perimeter of subject wafer to provide for proper gripping proximity. Preferably, the O-ring pads 24 are positioned to contact subject wafer in the outer perimeter area, such as 1 mm zone, once the wafer is centered.

When operating, active apparatus 30 uses multiple active contacts 48, 32 to provide effective centering of subject wafer, preferably independently of wafer diametral tolerance. Wafer gripping and centering actions are provided by at least one moving or the actuated contact 48 on the far side of the apparatus portions 34, as well as one moving contact 32 driven by plunger mechanically controlled by the solenoid 50, such contact 32 disposed in the opening 36 on near side of the apparatus 30. By mechanically closing on subject wafer in this gripping manner, centering is achieved such that variances in the wafer diameter are accounted.

Torsional coils provided within the active contact portion 34 serve to keep gripping mechanism in a default close position, but may be opened upon the solenoid 50 mechanical action. Preferably, the position capture electronics determines a wafer presence to ensure that the gripper apparatus is open properly to receive the wafer at an appropriate time, thereby avoiding inadvertent damage thereto.

The static blade extensions 18 of the robot arm end effector serve to support subject wafer vertically, thereby substantially eliminating the slippage during an apparatus gripping release action. Preferably, the gripping mechanism, which uses the actuated contacts 48, 32, provides centering effectively of subject the wafer by contacting wafer about the outer zone (e.g., 1 mm or other specified radial offset for outer ring). Once subject wafer is centered using such gripping mechanism, the wafer support is achieved using the immobile blade, preferably by resting the wafer edge on the O-rings 24 mounted thereon.

The full support of subject wafer on the blade platform 14 serves to substantially eliminate wafer slippage during the movement of robotic arm. Then, subject wafer may be placed as positioned upon a standard passive blade or various other platform. Preferably to reduce profile or height, gripper contacts 48, 32 are actuated using the thin metal bands 38 passing between the pivot or mounts 40, 42.

Mechanically, the gripping function uses three or more active contacts 48, 32, whose motion is coordinated by the bracket or similar device mounted in the base or stub arm 12, which couples to the solenoid 50 or any other actuator device for producing a mechanical force for moving the gripping mechanism described herein. Such bracket attaches to the stub arm in the base 12 through a linear slide, and preferably acts as a mounting point for the contact 32 nearest the stub arm. The stub arm in the base 12 serves mechanically as a foundation to mount the gripper mechanism or end effector to the robotic arm.

The active contact portions 34, particularly the actuated gripper portions or actuated contacts 48 mounted thereto, located at the end fingers 18 of the blade platform 14 and the pivot 44 between a point of subject wafer contact and the mount point 42 of the metal band 38 whose other end 40 connects through a bracket to the contact 32. As a result of the outer pivots 42, 44, the motion of the racket is reversed. Therefore, as bracket and inner contact are pulled away from the subject wafer, the bands 38 couple to the bracket through the band mounts 76 cause the outer contacts 48 to rotate and also pull away, thereby releasing a gripping action of the contacts 32, 48. Such contacts 32, 48 otherwise have a torsional spring force applied to cause convergence on the subject wafer for gripping and centering function. Optionally, the contacts 48 may be constructed using free rollers, as well as fixed alignment posts, to provide more flexible wafer gripping action.

Preferably, a clamping or gripping force is generated by the torsional spring located in the pivot joints 42 and 44 of the outer contacts 38. Such springs are pre-loaded such that normally clamp onto the subject a wafer. To release wafer, the solenoid is energized, thereby pulling the bracket and the contacts 32, 48 away from the wafer. When operating, the electromagnetic coil in the solenoid 50 causes the plunger disposed therein to move forward or backward, between the platform 14 toward the base 12.

To avoid the back-side contact, a wafer is supported by the O-rings 24 which touch only the outer edge of the exclusion zone. Such O-rings 24 attach to the blade platform 14 and provide a frictional surface to prevent wafer slippage as the contacts 32, 34 release the subject wafer. In applications which are less sensitive to the back-side contact, such O-ring pads 24 may be eliminated or replaced with other low-friction materials.

Preferably, there are two operating sequences for the gripping action, depending on the intended function. In applications requiring centering of a wafer without contacting the backside, subject wafer is centered in a carrier before pick-up. In this manner, the robot arm operates to enter the carrier between wafers, and raise-up until subject wafer positioned between gripper contacts.

The gripper does not raise to point of contacting pads. The contacts then operate to clamp or grip a wafer, at which time the wafer centering occurs relative to the gripper, while still positioned within the carrier. The gripper mechanism is then released and the blade 14 moves up. Subject wafer is then picked-up by the end effector, and re-gripped to prevent a slippage during the robot arm motion. Otherwise, if such operating sequence is omitted, the wafer eccentricity in the carrier may be sufficient to cause the blade pads to contact the back-side in a restricted area.

Alternately, if sufficient contact zone is approved around the wafer edge, the operating sequence for effective precentering (prior to the blade contact) within the carrier is not done. Here, the O-rings 24 replaced with a low-friction material that overlaps the wafer back-side to a higher degree than the O-rings 24. The gripper mechanism inserts into the carrier and raises until the pads support the wafer. Upon clamping, the wafer slides on or over the pads, thereby centering on the blade platform 14, at which point, subject wafer is transportable to a destination for placement release.

Figure 4:
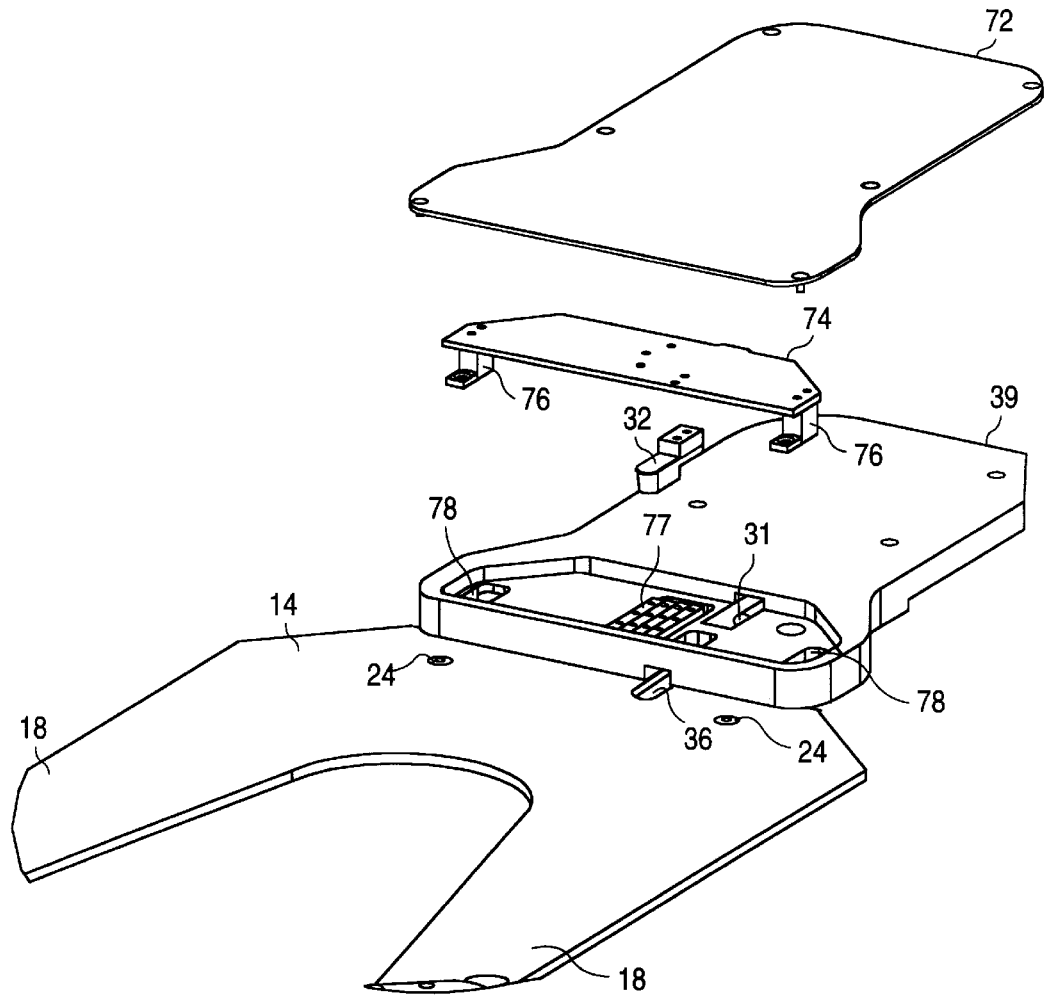
FIG. 4 is a mechanical diagram of the portion of an alternate embodiment (internal view) of the present invention.
Figure 5:
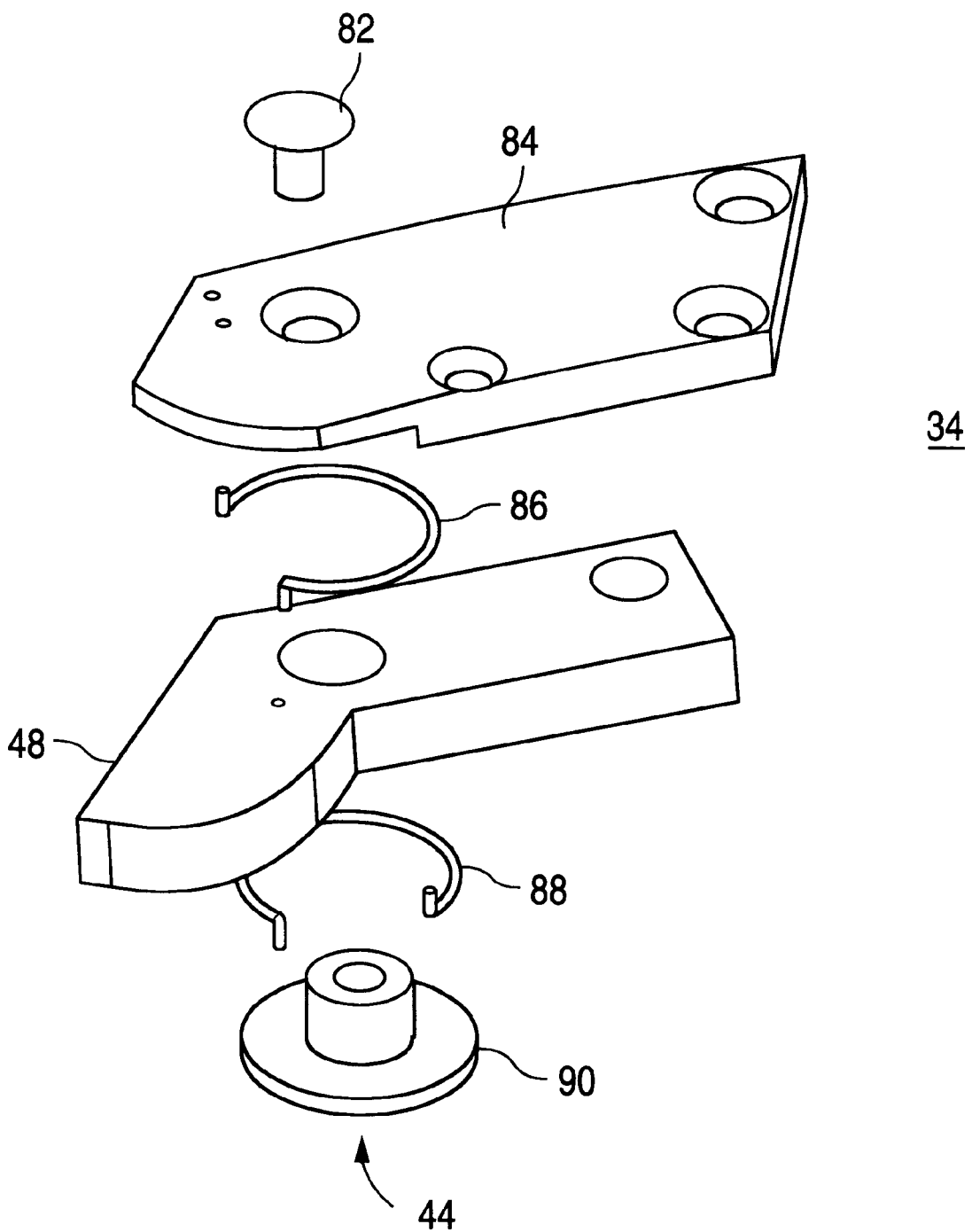
FIG. 5 is a mechanical diagram of an actuated contact portion 34 of an alternate embodiment of the present invention.

Internal mechanical portions of the active apparatus 30 are shown in FIG. 4 (base drive mechanism) and FIG. 5 (active contact portion). In FIG. 4, a cover 72 removed from the base 12 with a bracket 74 and the contact 32 are shown in exploded internal view, exposing the stub arm 39, which is effectively an end effector base mountable to a robotic arm. The bracket 74 includes band mounts 76, which are disposed in openings 78. Also shown are a linear slide 77 for the linearly coupling contact 32, as well as the solenoid plunger 31 which couples to the contact 32.

In FIG. 5, the active contact portion 34, as described operationally herein, is provided in an exploded internal view, particularly showing the pivot mechanism 44 as aligned vertically. In particular, the pivot mechanism 44 includes a screw 82 on top, a contact mount 84, a contact 48, torsional springs 86, 88, and a pivot shaft 44. Preferably, torsional springs 86, 88 serve to keep a gripper apparatus in a closed position, which may be caused to open by a solenoid movement.

FIG. 6 is an electrical block diagram of control electronics, including a solenoid 50 coupled to the actuated contacts shown in FIGS. 2 and 3, as well as a position capture 60, a pulse width modulation (PWM) driver 52, an isolation 54, a solenoid control and sensor processing (SCSP) 56, and a robot controller 58. The robot controller 58 provides a mechanical motion coordination about robot axes, for example, using a commercially-available robotic arm mechanism.

The SCSP 56, which may be implemented using a general purpose microprocessor or equivalent digital circuit, provides appropriate PWM duty cycles and monitors the status and position of a gripper mechanism via data from position capture electronics. The position capture electronics 60, which may be implemented using a commercially available capture-and-hold, comparators, and analog-to-digital components, serve to monitor a PWM signal provided to the solenoid 50.

FIG. 7 shows a sample current-varying signal such as the PWM signal which is a function of time (e.g., di/dt) that is useful for the present system. The PWM or other functionally similar signal modulation scheme is useful herein for controlling a voltage to mechanical device wherein the voltage is modulated by switching from on to off (i.e., a square wave function having certain frequency). Further, the PWM magnitude is adjusted by modulating the ratio between on and off cycle of the pulse stream to achieve the desired end effector movement or gripping action.

During off-phase of the PWM signal, the back EMF of solenoid shapes or distorts the PWM signal. The back EMF signal is produced by the solenoid 50 or other inductive device when turned off or input voltage reduced. Such distorted signal varies with position of solenoid plunger as well as the physical character of the solenoid and plunger, and can be used to determine the plunger position. The isolation 54, which may be implemented using available electrical isolation devices, serves to isolate power level components from digital level components in a circuit (i.e., SCSP 56).

The PWM driver 52 serves to amplify a digital pulse stream from the SCSP 56 and provide power to the actuate solenoid 50. Preferably, a simple wire pair couples to the solenoid 50 for supplying power and detecting the back EMF signal as described herein, thereby reducing the need to use additional wiring and electronics for monitoring and detecting a solenoid or actuator movement or position.

It is contemplated that a similar electromechanical system to achieve similar functional result could be implemented using capacitive force generating, pneumatic, hydraulic, so-called muscle or memory-wire components or equivalent devices.

As shown, the solenoid 50 serves as the actuation or gripping and position measurement device for a robotic material handling. The electrical actuator used to produce the gripping force provides a wafer presence information and monitors the state of the gripping mechanism. Preferably, the electrical actuator uses two wires for power and sensing information. The solenoid actuator 50 driven by the PWM technique uses the back electromotive force (EMF) levels and waveforms to derive a solenoid position. Further, the solenoid actuator 50 may adjust the output force based on an actuator or solenoid position to generate the appropriate force profile as a function of such position.

In accordance with important aspect of the present invention, centering and gripping system employs innovative feedback technique to obtain the real-time, accurate information which diagnoses the current physical status about subject substrate under processing. In particular, the back EMF signal from the solenoid 50 provides useful data to indicate a wafer presence, position, jam, as well as any circuit open/short or broken spring or other mechanism. Such data provides timely alarm for a corrective action, for example, to shut down a wafer handling system and related systems, thereby preventing or minimizing the wafer damage.

Optionally, solenoid 50 or plunger disposed therein may be provided in various shape, size, or other physical character, such as tapered cone shape, in order to optimize, or possibly tune for resonance condition, desired back EMF inductive signal response. Additionally, instead of using such inductive back EMF signal approach to monitor and diagnose wafer or platform conditions, present invention contemplates use of applying variable capacitance signal upon solenoid 50, for example, using discrete sets of various capacitive circuits coupled via corresponding relay circuits between solenoid electrical contacts.

Preferably, back EMF signal characteristic is empirically mapped or extrapolated to known or likely occurrence of certain wafer or gripper condition. For example, EMF signal characteristic, such as signal magnitude, peak values, or differential area, as compared to reference signal as actually measured, interpolated, or stored previously in look-up table, provide substantially predictable indication of wafer or platform physical condition.

Electrically when operating, the preferred embodiment uses the robot controller 58 to provide a command or instruction that the wafer gripper mechanism open. The controller 58 instructs or signals the SCSP 56 to increase the duty cycle of the PWM signal 52 to close the solenoid 50. The back EMF signal from the solenoid 50 monitored to determined when the solenoid 50 is engaged. For example, when the solenoid 50 is detected to be engaged fully, the duty cycle or power may be reduced accordingly, and the robot arm raises the gripper mechanism.

Then, the SCSP 56 instructed to clamp or grip subject wafer, preferably by reducing further PWM duty cycle, until the gripper mechanism begins to close. The back EMF is monitored via the position capture electronics 60, which accomplish such task under close loop control, thereby minimizing the impact on a wafer when the gripper engages. For example, FIGS. 8A, 8B show two PWM signals for two different solenoid positions.

Generally, the wafer or substrate transport system according to the present invention, which uses an electromechanical device such as solenoid or other motor function to move subject object coupled thereto operates initially by applying a current-varying signal as a function of time (i.e., di/dt), such as the PWM format signal, to such solenoid function. Then, the back EMF signal generated by the solenoid is detected, preferably to conduct subject object diagnostics, such as the presence or positional measurement.

Monitored back EMF signal is compared against a reference value from other such measurement or stored signal value to determine the relative movement or positional displacement of subject object, particularly between the solenoid coil and plunger, which is rigidly attached to transport or gripping mechanism.

Further, when subject the wafer is so gripped, the wafer is rapidly transportable to the next position, with virtually no risk of slippage. When the wafer arrives at new position, then release. The robot controller 58 sends a release command to a solenoid control processor 56. The release sequence is similar, but reverse of the clamping sequence. Again the PWM duty cycle is modulated to close the solenoid 50, the opening gripping mechanism, and the back EMF monitored to check the status or error. A duty cycle is reduced when the solenoid 50 engaged fully. The robot controller 58 lowers a gripper mechanism until clears the wafer, and issues a gripper-close command. The SCSP 556 reduces the PWM duty cycle to close a gripper mechanism.

FIG. 9 shows a representative pseudo-code for accomplishing the wafer transfer using present embodiment for wafer gripping and centering. Key steps include: moving the robot to a wafer pick-up position, opening solenoid, wafer gripping, moving wafer to a drop-off position, lowing gripper, etc. As illustrated, the following terms are used:

PWM_ON: Duty cycle of the PWM for opening the solenoid
PWM_Open: Duty cycle for keeping the solenoid open
PWM_Close: Duty cycle to let the solenoid close
EMF_Value: Sensor value of the solenoid back EMF
EMF_Ave: Time-averaged value of signal
EMF_Open: EMF value when open solenoid
EMF_Grip: EMF value when the solenoid gripping wafer
Open_Error: Error for failed solenoid open
Grip_Error: Error for incorrect wafer grip Foregoing sequences may be repeated for each wafer for transport. The SCSP 56 determines various diagnostic data from the back EMF, such as a wafer presence, a solenoid health, and the gripper current position.

Further, it is contemplated that multiple end effectors or gripping apparatus as described herein may be constructed and operated in a combined implementation. For example, the first passive or active apparatus is provided as specified herein, and the second passive or active apparatus as specified herein is mounted thereon aligned at angle or linearly with other apparatus to share the common base 12 connected to the robotic arm. Preferably such combined multiple-effector implementation uses different solenoid and associated drive mechanisms and electronics for independent gripping and centering action.

We claim:

1. A system for centering a semiconductor wafer comprising:
   a movable platform for receiving a wafer;
   a solenoid for detecting at least one state in the wafer; and
   a plurality of curved contacts mounted on the movable platform, the plurality of contacts substantially centering the wafer on the movable platform when the solenoid actuated the contacts to move radially into the wafer thereby producing a relative movement between the wafer and the movable platform.

2. The apparatus of claim 1 wherein the solenoid detects at least one state including the presence of the wafer the absence of the wafer and the contacts open.

3. The apparatus of claim 1 further comprising a plurality of wires for providing position information from the plurality of curved contacts.

4. The apparatus of claim 1 wherein the plurality of curved contacts contact an edge of the wafer during wafer handling.

5. The apparatus of claim 1 wherein at least one contact in the plurality of curved contacts comprises an actuator, and the apparatus further comprising the solenoid coupled to each actuator for measuring wafer position.

6. A method for centering a semiconductor wafer comprising the steps of:
   providing a movable platform having a plurality of curved contacts mounted thereon;
   receiving a wafer on the platform;
   actuating the plurality of curved contacts by a solenoid, the solenoid detecting a state of the semiconductor wafer on the platform; and
   substantially centering the wafer on the platform using the plurality of curved contacts, when the solenoid actuating the plurality of curved contacts to move radially into the wafer thereby producing a relative movement between the wafer and the movable platform.

7. The method of claim 6 wherein a state includes a presence of the wafer an absence of the wafer and the contacts open.

8. The method of claim 7 wherein each contact in the plurality of curved contacts comprises an actuator, and a response to a signal applied to the actuator is monitored to sense the wafer.

9. The method of claim 8 wherein the solenoid is coupled to each actuator, and the solenoid measures contact position.

10. The method of claim 9 wherein a diagnostic is performed according to a measurement by the solenoid.

11. The method of claim 6 wherein the solenoid receives a pulse-width-modulated signal and determines the position according to a back electromotive force value or waveform.

12. The method of claim 6 wherein the solenoid applies a force to each actuator according to a measured position of the actuator.

13. The method of claim 6 wherein the solenoid determines the position according to a variable capacitive value or waveform.

14. The method of claim 6 wherein the plurality of curved contacts provide position information from the contacts using a plurality of wires.

15. The method of claim 6 wherein the plurality of curved contacts contact a wafer edge during handling.

16. The method of claim 6 wherein each contact in the plurality of curved contacts comprises an actuator which is coupled to a solenoid for measuring wafer position.

17. The method of claim 6 wherein the plurality of curved contacts comprise two alignment posts, and the platform comprises a fixed blade, and centering comprises registering the wafer against the posts mounted on the blade.

18. The method of claim 17 wherein each contact is actuated and has a line of action converging to a center area.

19. The method of claim 17 wherein each contact has linear or rotating motion.

20. In an electromechanical system using a solenoid to move an object, a method for operating the solenoid comprising the steps of:

applying a first signal to a solenoid;

detecting a back electromotive force (EMF) signal generated by the solenoid, the detected back EMF signal indicating a first state or a second state of a wafer; and comparing the detected back EMF signal against a second signal value.

21. The method of claim 20 wherein the first signal comprises a pulse-width modulated signal.

22. The method of claim 20 wherein the second signal value comprises indicating the first state or the second state of the wafer, the first state including a presence of the wafer, and the second state including a non-presence of the wafer.

* * * * *